(12) United States Patent
Fujino

(10) Patent No.: US 10,879,069 B2
(45) Date of Patent: Dec. 29, 2020

(54) METHOD AND APPARATUS FOR FORMING HARD MASK FILM AND METHOD FOR MANUFACTURING SEMICONDUCTOR DEVICES

(71) Applicant: Tokyo Electron Limited, Tokyo (JP)

(72) Inventor: Yutaka Fujino, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/510,519

(22) Filed: Jul. 12, 2019

(65) Prior Publication Data

US 2020/0035491 A1    Jan. 30, 2020

(30) Foreign Application Priority Data

Jul. 25, 2018  (JP) .................................. 2018-139051

(51) Int. Cl.
| H01L 21/00 | (2006.01) |
| C23C 16/511 | (2006.01) |
| H01J 37/32 | (2006.01) |
| H01L 21/033 | (2006.01) |
| H01L 21/02 | (2006.01) |

(Continued)

(52) U.S. Cl.
CPC ........ *H01L 21/0335* (2013.01); *C23C 16/345* (2013.01); *C23C 16/4583* (2013.01); *C23C 16/46* (2013.01); *C23C 16/511* (2013.01); *H01J 37/3222* (2013.01); *H01J 37/32724* (2013.01); *H01L 21/0217* (2013.01); *H01L 21/02274* (2013.01); *H01L 21/0332* (2013.01);

*H01L 21/0337* (2013.01); *H01L 21/31116* (2013.01); *H01L 21/31144* (2013.01);
(Continued)

(58) Field of Classification Search
CPC ............. H01L 21/0337; H01L 21/0332; H01L 21/32135; H01L 21/32139; H01L 21/02274; H01L 21/31144; H01L 21/0335; H01L 21/0217; H01L 21/31116; H01L 21/67103; H01L 21/67248; C23C 16/4583; C23C 16/46; C23C 16/511; C23C 16/345; H01J 37/3222; H01J 37/32724; H01J 2237/3321
See application file for complete search history.

(56) References Cited

U.S. PATENT DOCUMENTS

| 4,985,109 A * | 1/1991 | Otsubo .............. H01J 37/32357 156/345.41 |
| 7,968,915 B2 * | 6/2011 | Kanarsky ........ H01L 21/823412 257/199 |

(Continued)

FOREIGN PATENT DOCUMENTS

| JP | 2009-246129 A | 10/2009 |
| JP | 2012-015343 A | 1/2012 |

(Continued)

*Primary Examiner* — Nikolay K Yushin
(74) *Attorney, Agent, or Firm* — Fenwick & West LLP

(57) ABSTRACT

A hard mask film forming method includes preparing a substrate in which an etching target film is formed on a base. The hard mask film forming method further includes forming a hard mask film on the substrate while controlling film forming parameters such that tensile stress is set as initial film stress and the tensile stress monotonously increases from a bottom surface of the hard mask film toward an upper surface of the hard mask film.

19 Claims, 14 Drawing Sheets

(51) Int. Cl.
*H01L 21/311* (2006.01)
*H01L 21/3213* (2006.01)
*C23C 16/34* (2006.01)
*C23C 16/46* (2006.01)
*C23C 16/458* (2006.01)

(52) U.S. Cl.
CPC .. *H01L 21/32135* (2013.01); *H01L 21/32139* (2013.01); *H01J 2237/3321* (2013.01)

(56) References Cited

U.S. PATENT DOCUMENTS

2008/0054415 A1* 3/2008 Frohberg .......... H01L 21/31612
257/642
2009/0298297 A1* 12/2009 Kanarsky ............ H01L 29/7847
438/761

FOREIGN PATENT DOCUMENTS

| JP | 2016-066717 A | 4/2016 |
|----|---------------|--------|
| JP | 2017-168870 A | 9/2017 |

\* cited by examiner

METHOD AND APPARATUS FOR FORMING HARD MASK FILM AND METHOD FOR MANUFACTURING SEMICONDUCTOR DEVICES

CROSS-REFERENCE TO RELATED APPLICATIONS

This application claims priority to Japanese Patent Application No. 2018-139051, filed on Jul. 25, 2018, the entire contents of which are incorporated herein by reference.

TECHNICAL FIELD

The present disclosure relates to a method and apparatus for forming a hard mask, and a method for manufacturing semiconductor devices.

BACKGROUND

A semiconductor device manufacturing process includes a step for performing plasma etching on a predetermined film. Conventionally, a photoresist has been widely used as an etching mask. However, as a pattern is miniaturized, a material of a resist mask has low resistance to an etching gas or plasma, which makes it difficult to maintain the pattern until the end of the etching. Therefore, a hard mask formed by transferring a pattern of a resist mask to an SiN film or the like by etching is used.

Recently, due to the scaling (miniaturization) of semiconductor devices, the wiring width has narrowed. Further, wiggling may occur in the hard mask after the etching using the hard mask.

It is known that the wiggling is caused by film stress of the hard mask. Japanese Patent Application Publication No. 2016-66717 proposes that a hard mask is made of a material having low film stress.

Japanese Patent Application Publication No. 2012-15343 proposes that a protective film is formed on a sidewall of a mask to prevent wiggling.

Japanese Patent Application Publication No. 2017-168870 proposes a technique for preventing wiggling by adjusting a ratio of a height h and a length L of a plurality of control gate groups.

SUMMARY

The present disclosure provides a method and an apparatus for forming a hard mask film that can effectively suppress occurrence of wiggling during etching even when an etching pattern is further miniaturized, and a method for manufacturing semiconductor devices.

In accordance with an aspect of the present disclosure, there is provided a hard mask film forming method, including: preparing a substrate in which an etching target film is formed on a base; and forming a hard mask film on the substrate while controlling film forming parameters such that tensile stress is set as the initial film stress and the tensile stress monotonously increases from a bottom surface of the hard mask film toward an upper surface of the hard mask film.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

<Circumstances>

First, the circumstances that have led to a hard mask film forming method according to an embodiment will be described.

As for the hard mask, a silicon-based film such as a SiN film or the like, or a metal-based film such as a TiN film or the like is widely used.

Figure 1:
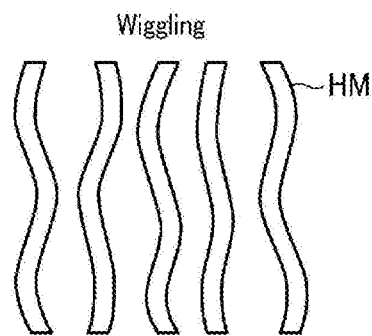
FIG. 1 explains wiggling.

Recently, due to the scaling (miniaturization) of semiconductor devices, a wiring width has narrowed. Further, when dry etching is performed on an etching target film using a hard mask, wiggling may occur at an upper end portion of a remaining hard mask HM as shown in FIG. 1.

It is known that wiggling occurs when film stress of the hard mask is released at the upper end thereof. Japanese Patent Application Publication No. 2016-66717 proposes that a hard mask is made of a material having low film stress. In addition, bulk stress of a film forming the hard mask is controlled by controlling manufacturing conditions or the like.

However, recently, as the devices are further miniaturized, a width of the film after etching decreases and an aspect ratio increases. Therefore, it is difficult to suppress wiggling only by using the hard mask film made of a material having low stress or controlling the bulk stress of the hard mask.

As described above, the wiggling occurs when the stress of the film forming the hard mask is released at the upper end thereof. Therefore, as will be described below, the wiggling is prevented by generating tensile stress (stress that causes the film to shrink).

Figure 2:
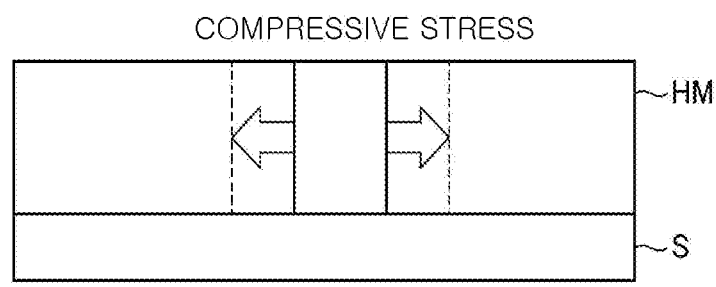
FIG. 2 explains the case where compressive stress is generated in a hard mask after etching.
Figure 3:
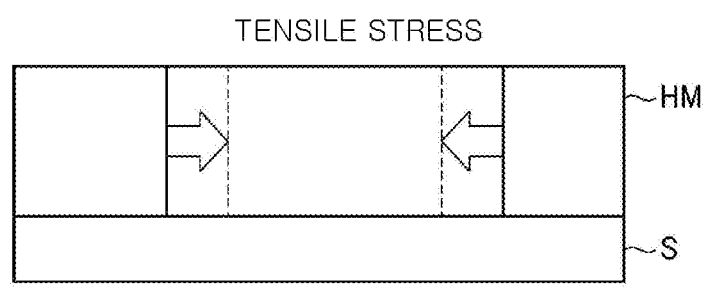
FIG. 3 explains the case where tensile stress is generated in the hard mask after the etching.

When compressive stress (stress that causes the film to expand) occurs in the hard mask HM after the etching as shown in FIG. 2, the film forming the hard mask HM tends to expand. However, since a bottom portion of the film is restrained by an underlying film (substrate) S, only the upper end portion of the film expands and wiggling occurs at the upper end portion of the film. On the other hand, when tensile stress (stress that causes the film to shrink) occurs in the hard mask HM after the etching as shown in FIG. 3, the film tends to shrink. However, since the bottom of the film forming the hard mask is restrained by the underlying film (substrate) S, only the upper end portion of the film is pulled and wiggling does not occur. Accordingly, even if the etching pattern is further miniaturized, the wiggling can be suppressed by applying appropriate tensile stress to the film forming the hard mask.

Figure 4A:
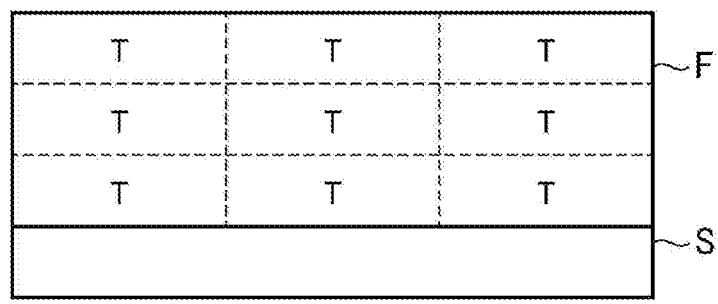
FIG. 4A shows an ideal state in which the hard mask has uniform tensile stress.
Figure 4B:
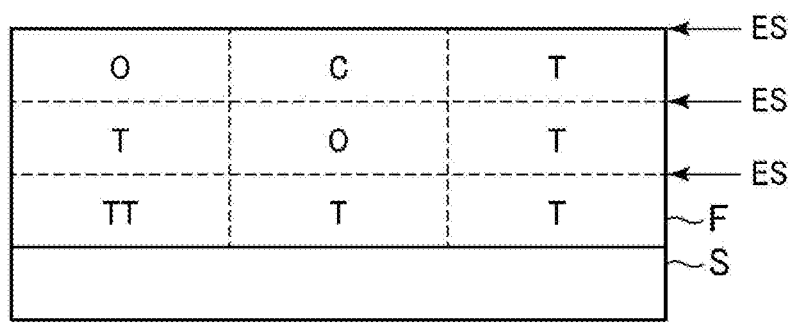
FIG. 4B shows an actual state in which stress variation occurs even when it is controlled to generate uniform tensile stress.

However, even if the film stress of the hard mask film F is ideally controlled to obtain uniform tensile stress T as shown in FIG. 4A, stress variation occurs in an actual case. In other words, uniform tensile stress T is not obtained in the actual stress distribution in the hard mask film F as shown in FIG. 4B. Specifically, there are parts having higher tensile stress TT, neutral parts 0 having no stress, and parts having compressive stress C. In this state, if an etching target film as an underlying film is etched while using the hard mask film F as a hard mask, the etching amount of the hard mask changes depending on the process. Therefore, as shown in FIG. 4B, an etching stop position ES changes and, thus, the stress at the etching stop position ES changes. If the width of the pattern is narrow and the aspect ratio is high, wiggling may occur depending on the stress at the etching stop position ES. In other words, when a stress in an upper surface region of the hard mask after the etching is closer to a compressive stress compared to an area deeper than the upper surface region, the upper surface region relatively has compressive stress. Accordingly, wiggling may occur in the upper surface area.

Therefore, in the embodiment, when the hard mask film is formed on the film to be etched by dry etching, film forming parameters are controlled such that tensile stress is set as initial film stress and increases monotonously from the bottom surface to the upper surface of the film.

Due to the above stress distribution, any part of the film has larger tensile stress than that in a deeper part thereof. Therefore, when the etching target film is etched while using the above hard mask film as the hard mask, tensile stress acts on the upper surface of the remaining hard mask regardless of the etching stop position of the hard mask. Accordingly, the occurrence of wiggling can be effectively suppressed even if the pattern becomes finer, the width of the remaining portion becomes thinner, and the aspect ratio of the shape of the remaining portion becomes higher.

<Hard Mask Film Forming Method>

Next, a hard mask film forming method according to an embodiment will be described.

Figure 5:
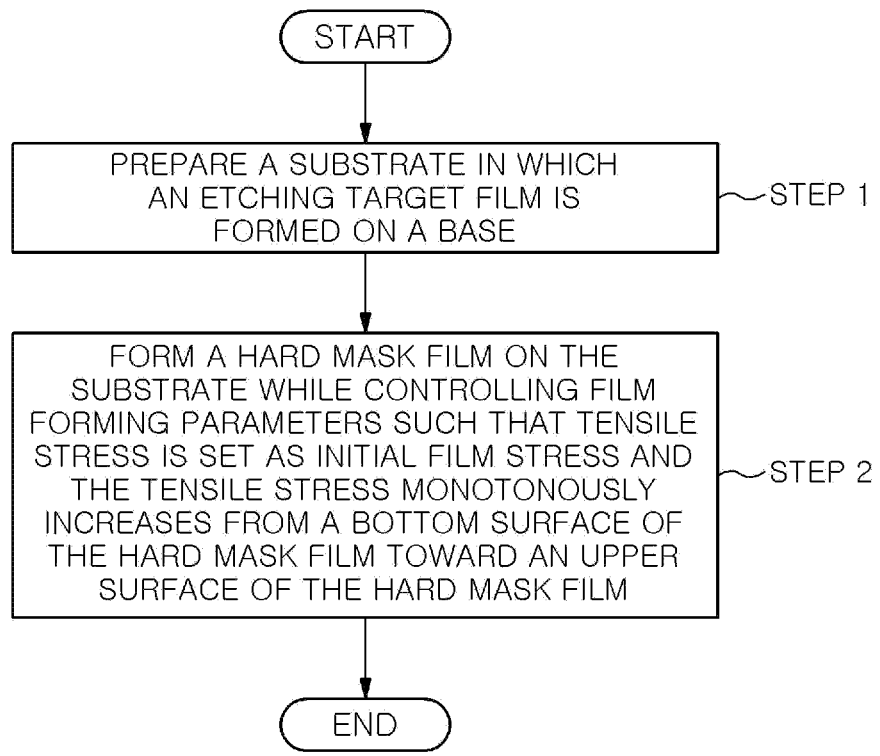
FIG. 5 is a flowchart showing a hard mask film forming method according to one embodiment.
Figure 6A:
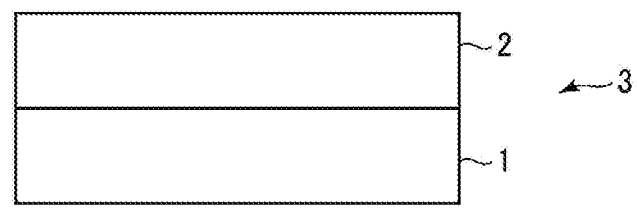
FIGS. 6A and 6B are process cross-sectional views showing the hard mask film forming method according to the embodiment.
Figure 6B:
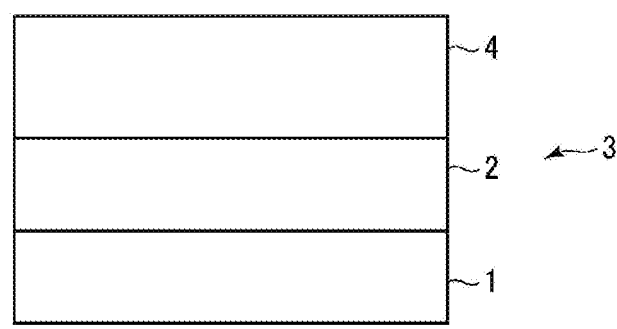

FIG. 5 is a flowchart showing the hard mask film forming method according to the embodiment. FIGS. 6A and 6B are cross-sectional views showing steps in the flowchart.

First, a substrate 3 in which an etching target film 2 is formed on a base 1 is prepared (step 1, see FIG. 6A).

The base 1 is not particularly limited, and may be typically a semiconductor such as silicon or the like. In that case, the substrate 3 may be a semiconductor wafer. The etching target film 2 is not particularly limited, and may be, e.g., a tungsten film, a GST (GeSbTe) film, a Poly-Si film, a carbon film, an $SiO_2$ film, an SiON film, or the like. Further, the etching target film 2 may be a laminated film in which a plurality of films is laminated.

Next, a hard mask film 4 is formed on the substrate 3 while controlling film forming parameters such that tensile stress is set as initial film stress and increases monotonously from a bottom surface toward an upper surface of the film (step 2, see FIG. 6B).

The hard mask film 4 may serve as a hard mask for etching the etching target film 2, such as an SiN film, an $SiO_2$ film, an SiON film, or the like. The SiN film may contain metal (Al or the like).

At this time, the film forming method is not particularly limited, and may be, e.g., a chemical vapor deposition (CVD) method. For example, a plasma CVD method (PE-CVD method) can be used. In addition, a microwave plasma source can be used as a plasma source at the time of forming a film using the plasma CVD method. By using microwave plasma, a film can be formed at a relatively low temperature, and a film having a good film quality can be formed by high-density plasma at a low electron temperature. For example, an SiN film can be formed within a temperature range from 250° C. to 550° C., and low-temperature film formation at a temperature of 400° C. or less can be performed.

Figure 7:
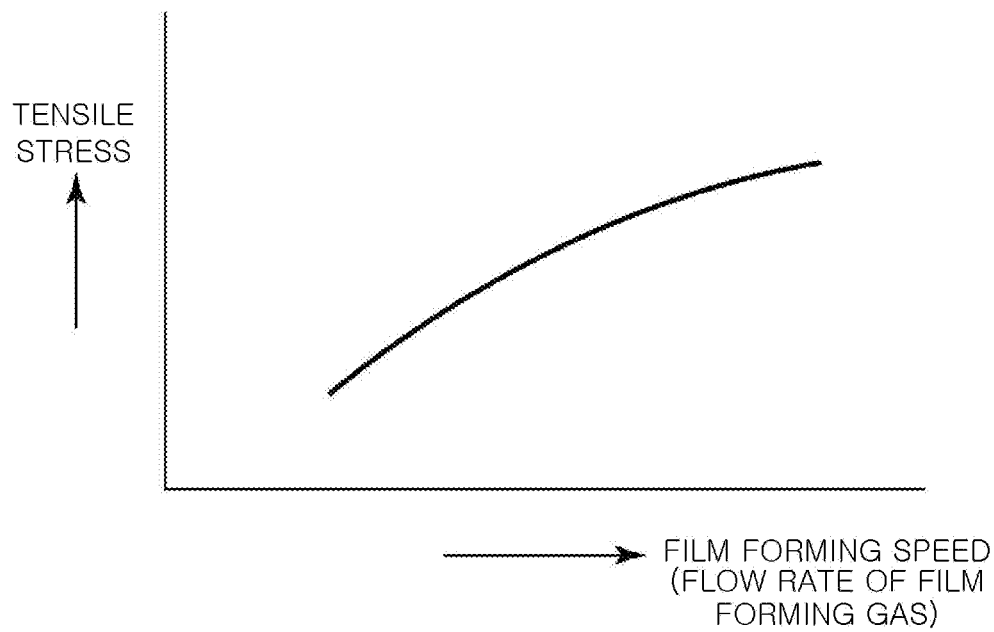
FIG. 7 is a graph schematically showing a relationship between a film forming speed and film stress in the case of forming a hard mask film by microwave plasma chemical vapor deposition.
Figure 8:
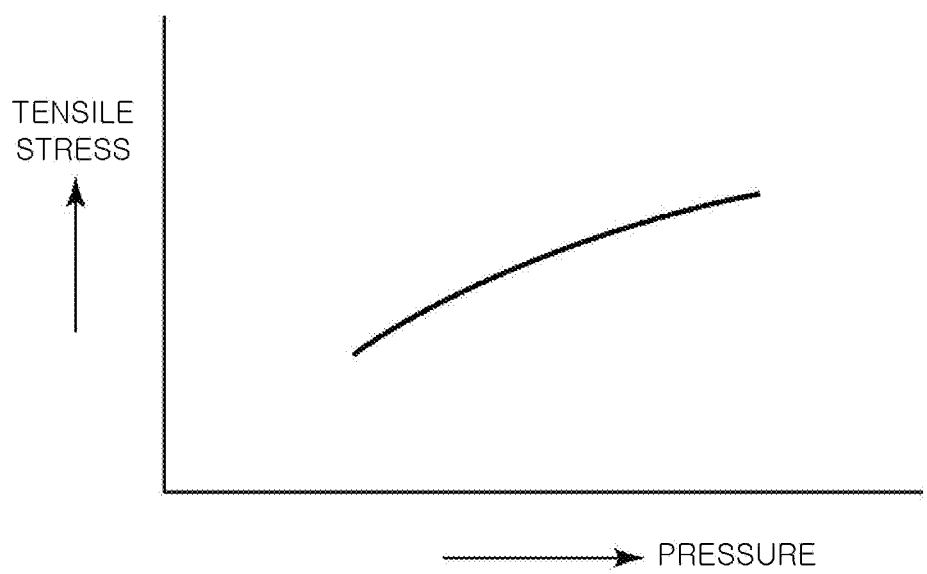
FIG. 8 is a graph schematically showing a relationship between a pressure and film stress in the case of forming the hard mask film by the microwave plasma chemical vapor deposition.
Figure 9:
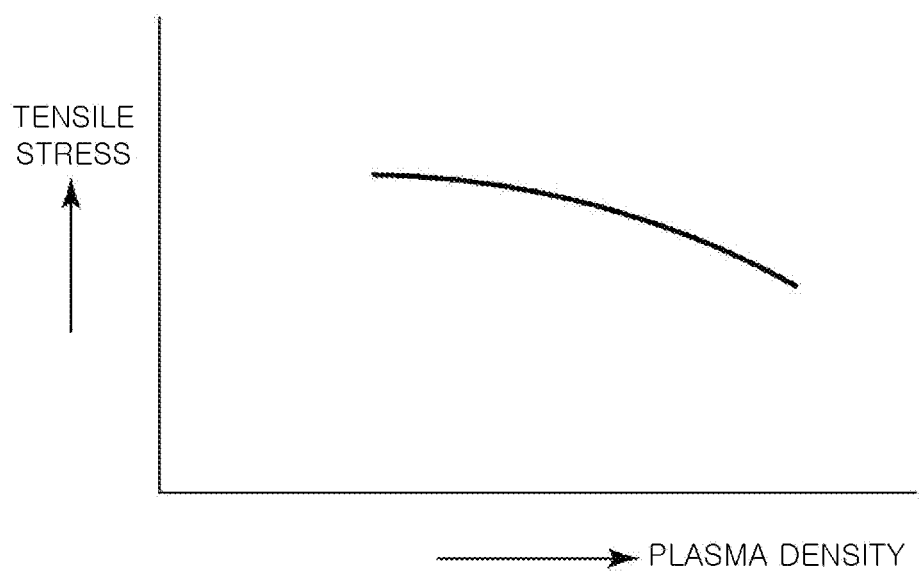
FIG. 9 is a graph schematically showing a relationship between a plasma density and film stress in the case of forming the hard mask film by the microwave plasma chemical vapor deposition.

At this time, the film stress of the hard mask film 4 to be formed can be controlled by controlling the film forming parameters (process parameters) depending on time during the film formation. For example, when the film is formed by microwave plasma CVD, the tensile stress tends to be increased by increasing a film forming speed (by increasing a flow rate of a film forming gas) as shown in FIG. 7. Further, the tensile stress tends to be increased by increasing a pressure as shown in FIG. 8. Moreover, the tensile stress tends to be increased by decreasing a plasma density (power) as shown in FIG. 9. Therefore, the film stress can be controlled by controlling at least one of the film forming speed, the pressure, and the plasma density as the film forming parameters. The control of the film stress using the film forming parameters can also be performed by another plasma CVD method.

Therefore, the initial film forming conditions of the hard mask film 4 are set such that tensile stress is set as initial film stress, and one of the film forming parameters (process parameters) is controlled to monotonously increase the tensile stress. For example, the film formation is performed using a multi-step process recipe in which the gas flow rate gradually increases from the initial film forming conditions.

Figure 10A:
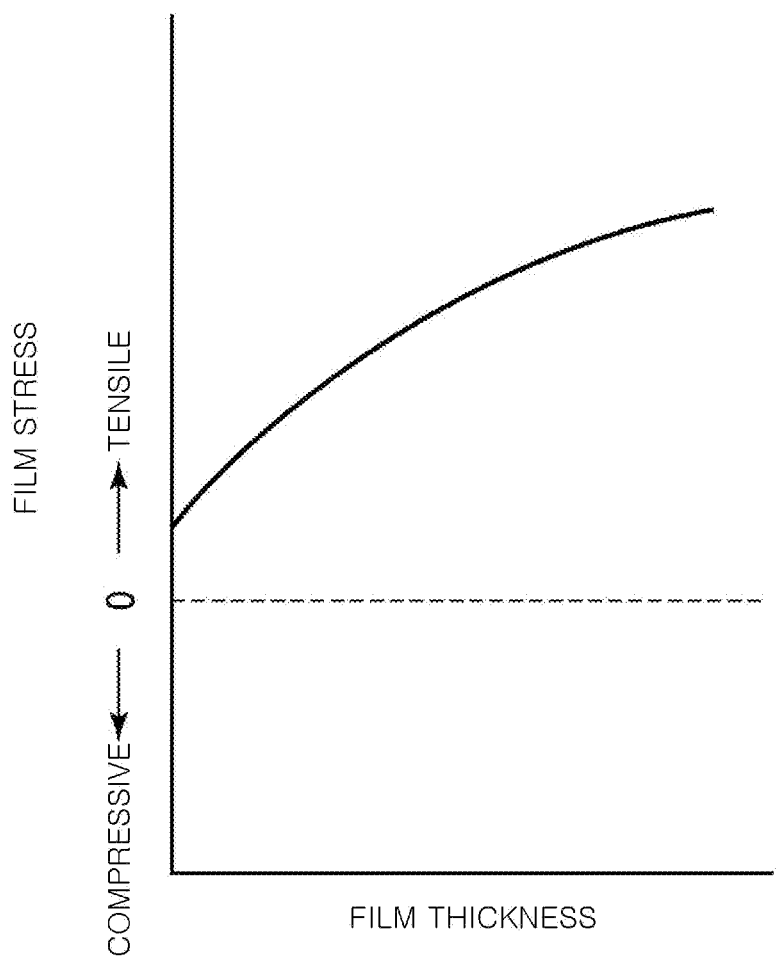
FIG. 10A is a graph showing stress distribution in a film thickness direction of the hard mask film formed by the hard mask film forming method according to the embodiment.
Figure 10B:
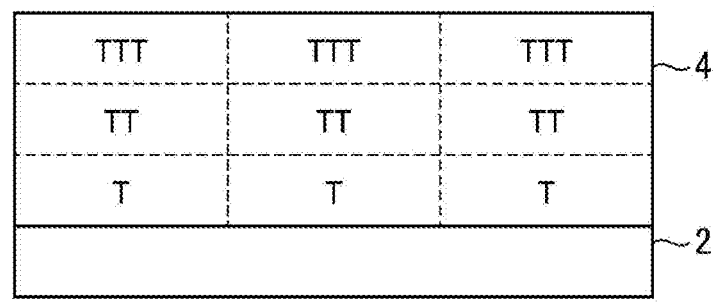
FIG. 10B schematically shows stress distribution of the hard mask film formed by the hard mask film forming method according to the embodiment.

Accordingly, it is possible to obtain the stress distribution shown in FIG. 10A in which the tensile stress becomes the film stress in the initial stage of the film formation of the hard mask film 4 and monotonously increases from the bottom surface toward the upper surface of the film. FIG. 10B schematically shows the film stress distribution at that time. In FIG. 10B, "T" indicates the tensile stress, and a large number of "T" indicates higher tensile stress.

<Semiconductor Device Manufacturing Method>

Next, a semiconductor device manufacturing method using the hard mask film 4 thus formed as a hard mask will be described.

Figure 11:
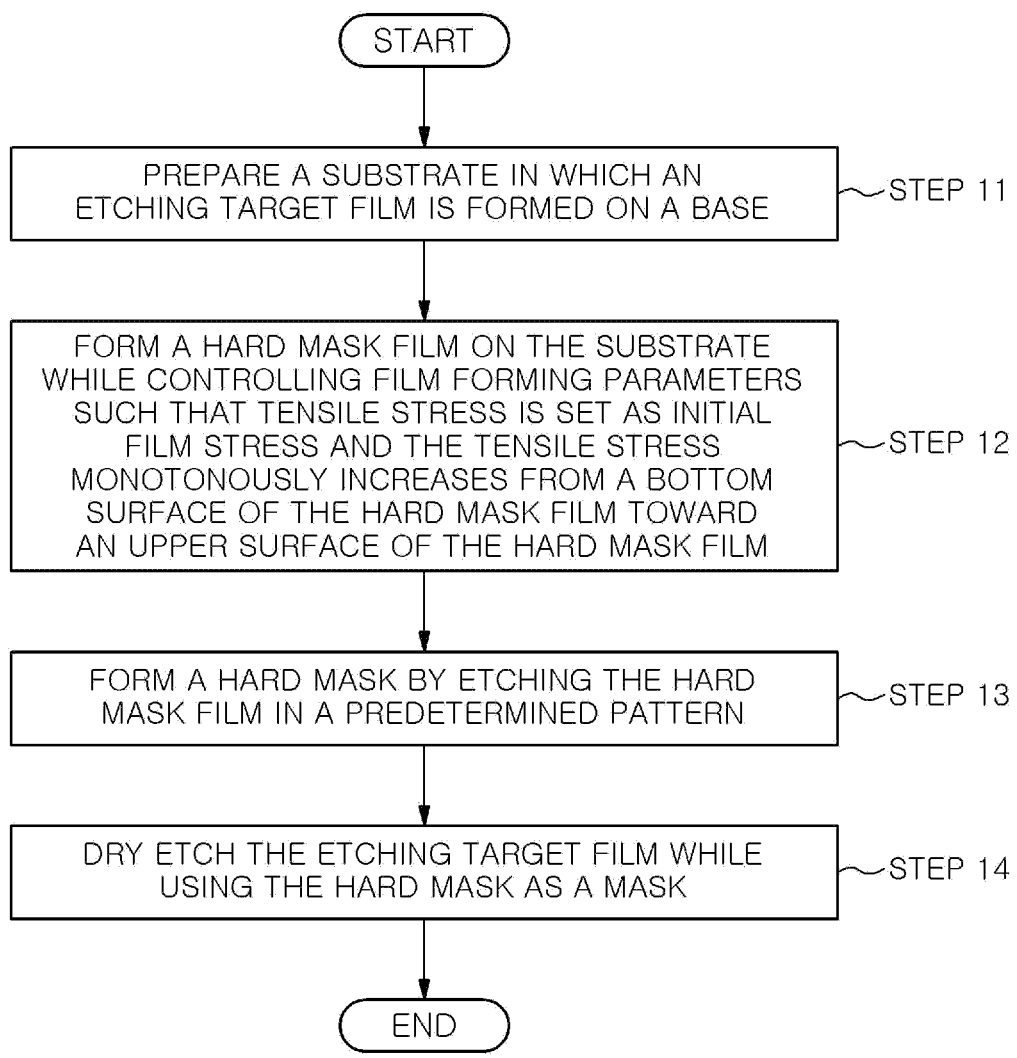
FIG. 11 is a flowchart showing a semiconductor device manufacturing method according to the embodiment.

FIG. 11 is a flowchart showing the semiconductor device manufacturing method according to an embodiment. FIGS. 12A to 12D are cross-sectional views showing steps in the flowchart.

Figure 12A:
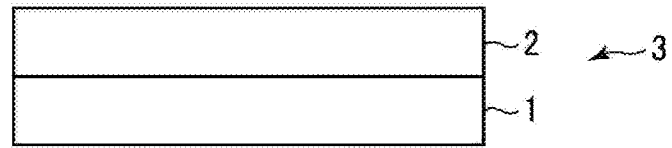
FIGS. 12A to 12D are cross-sectional views showing the process of the semiconductor device manufacturing method according to the embodiment.
Figure 12B:
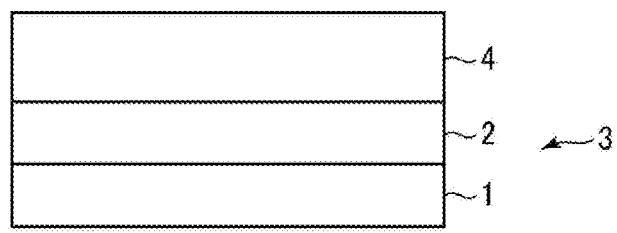
Figure 12C:
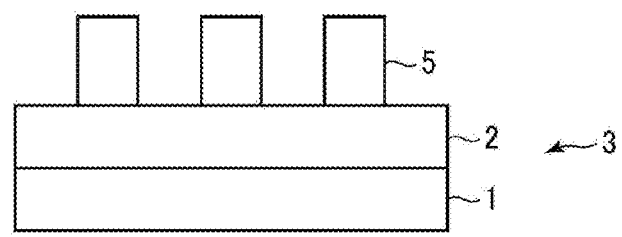

First, a substrate 3 in which an etching target film 2 is formed on a base 1 is prepared (step 11, see FIG. 12A). Next, a hard mask film 4 is formed on the substrate 3 while controlling film forming parameters such that the tensile stress is set as the initial film stress and monotonously increases from the bottom surface toward the upper surface of the film (step 12, see FIG. 12B). The steps 11 and 12 are the same as the steps 1 and 2.

Next, a predetermined pattern is formed by, e.g., photolithography. Then, the hard mask film 4 is dry-etched in a predetermined pattern while using the pattern formed by the photolithography as a mask, thereby forming a hard mask 5 (step 13, see FIG. 12C).

Figure 12D:
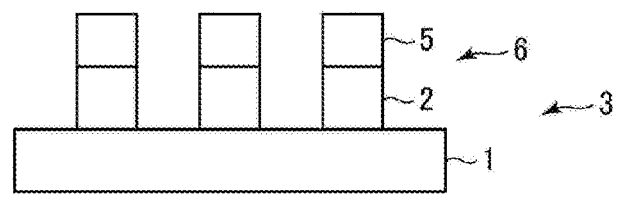

Next, the etching target film 2 is dry-etched while using the hard mask 5 as a mask (step 14, see FIG. 12D). Accordingly, the hard mask 5 and the etching target film 2 remain in a predetermined pattern and become a remaining portion 6.

The etching of the hard mask film 4 in the step 13 and the etching of the etching target film 2 in the step 14 may be performed consecutively.

Figure 13:
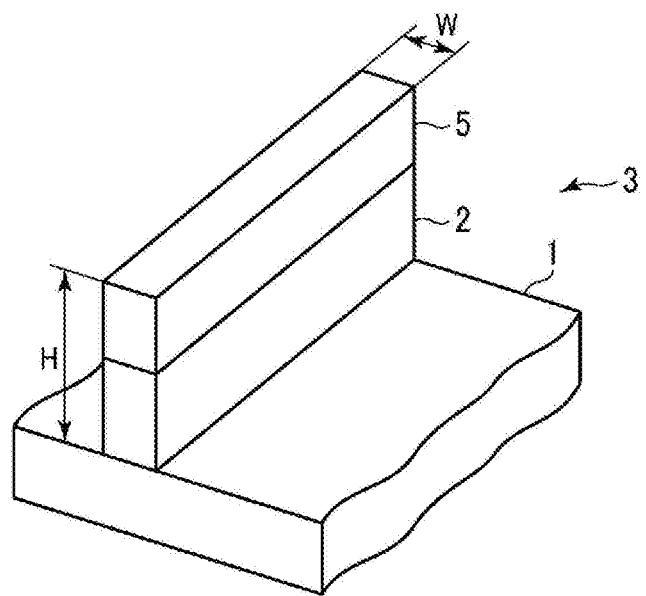
FIG. 13 explains a shape of a hard mask after etching.

Due to the scaling (miniaturization) of the semiconductor devices, the pattern width becomes thinner. Therefore, the remaining portion 6 of the etching target film 2 and the hard mask 5 after the etching has a width W of 5 to 30 nm and a height H of 10 to 200 nm as shown in FIG. 13. If the width W is small and the height H is large, the aspect ratio increases. Therefore, in a conventional case, wiggling often occurs at the upper surface portion of the hard mask 5.

On the other hand, in the present embodiment, the hard mask film 4 is formed while controlling the film forming parameters such that the tensile stress is set as the film stress and increases monotonously from the bottom surface toward the upper surface of the film. In other words, gradation of the tensile stress is generated in a film thickness direction of the hard mask film 4.

Due to the above stress distribution, any part of the hard mask film 4 has higher tensile stress than that in deeper parts thereof. Therefore, when the etching target film 2 is etched while using the hard mask film 4 as the hard mask 5, the tensile stress acts on the upper surface of the hard mask 5 regardless of the etching stop position of the hard mask 5. Accordingly, the occurrence of wiggling can be effectively suppressed by the tensile stress even if the pattern becomes finer, the width of the remaining portion after the etching becomes thinner, and the aspect ratio of the shape of the remaining portion becomes higher.

Due to the tensile stress gradation in the hard mask film 4, the wiggling can be suppressed even if the bulk film stress of the hard mask film 4 is relatively small. Since large bulk film stress is not required, it is possible to relax the adhesive property requirement of the etching target film 2 adjacent to the bottom surface of the hard mask 5.

Further, by generating the tensile stress gradation in the hard mask film 4, the bulk film stress can be controlled depending on the condition of integration.

Since it is not required to increase the bulk film stress in order to suppress wiggling, the margin for the film quality parameters (e.g., a film density, a modulus, and the like) of the hard mask film 4 becomes wider.

<Film Forming Apparatus>

Next, an example of a film forming apparatus suitable for forming a hard mask film according to an embodiment will be described. The film forming apparatus in this example is configured as a microwave plasma film forming apparatus using a microwave plasma source having a plurality of small-sized microwave radiation mechanisms.

Figure 14:
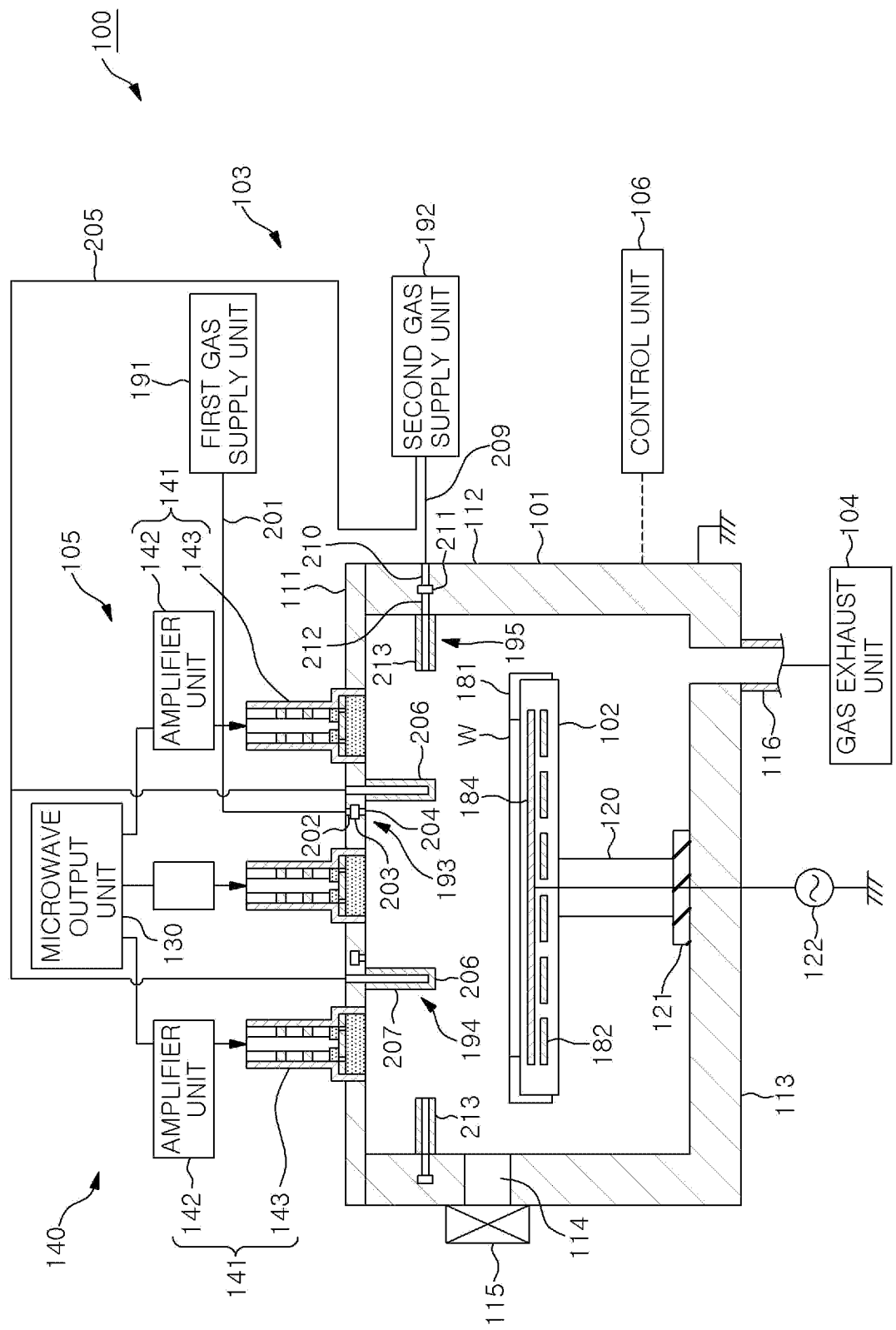
FIG. 14 schematically shows an example of a film forming apparatus suitable for forming a hard mask film according to the embodiment.
Figure 15:
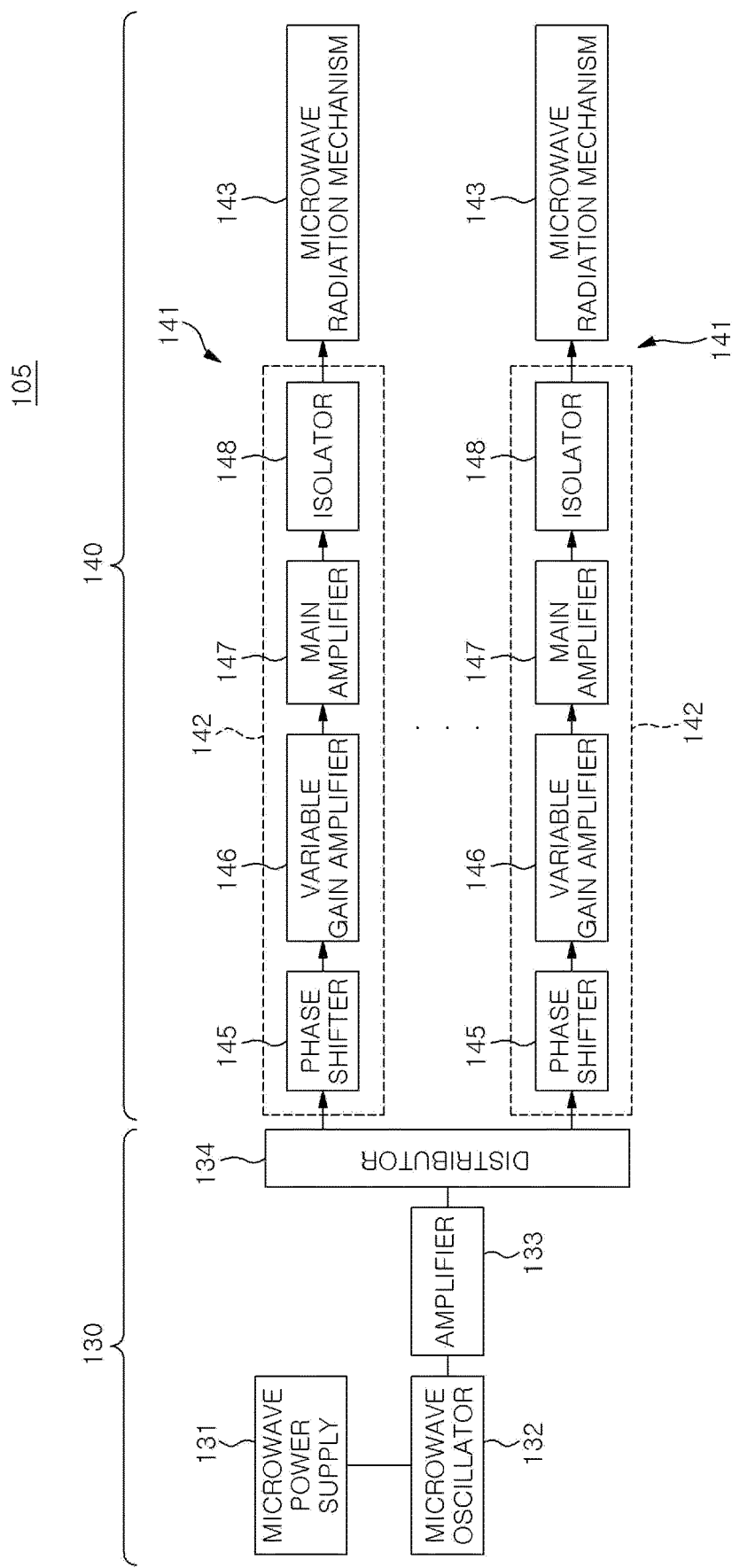
FIG. 15 is a block diagram showing a configuration of a microwave introduction device of the film forming apparatus shown in FIG. 14.
Figure 16:
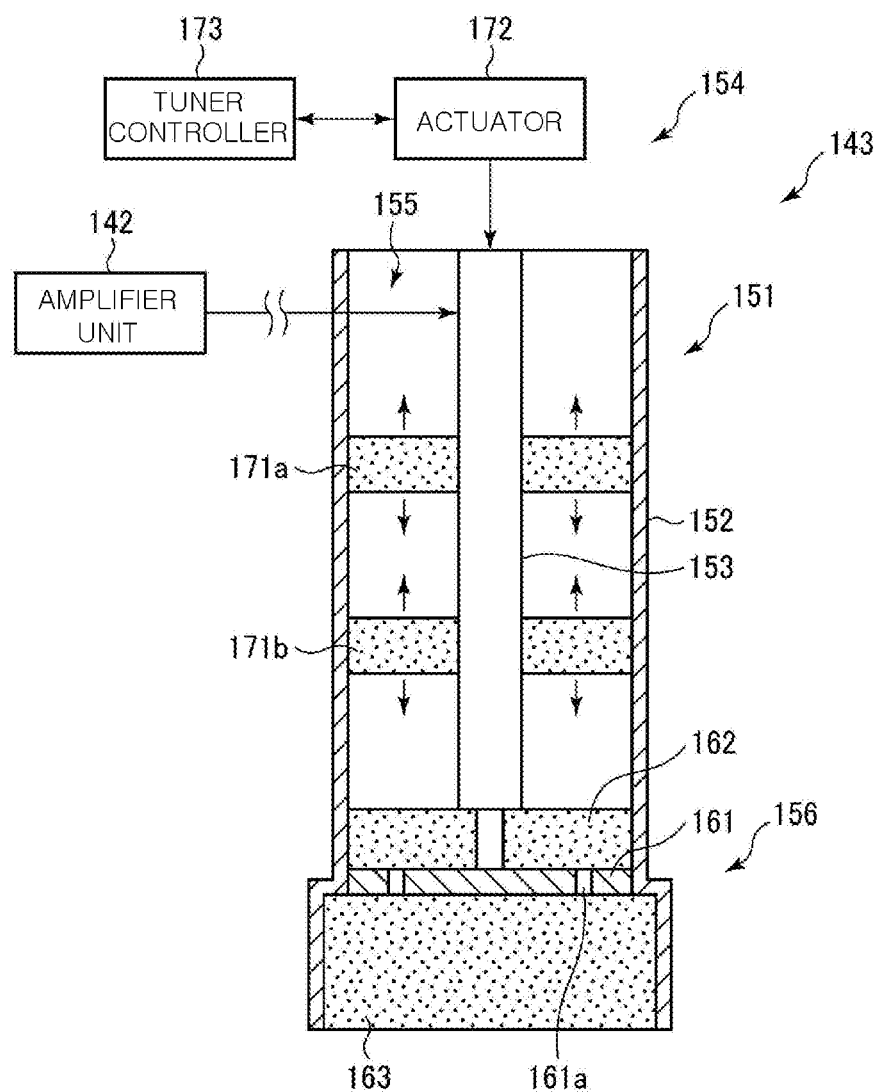
FIG. 16 is a cross-sectional view schematically showing a microwave radiation mechanism of the film forming apparatus shown in FIG. 14.
Figure 17:
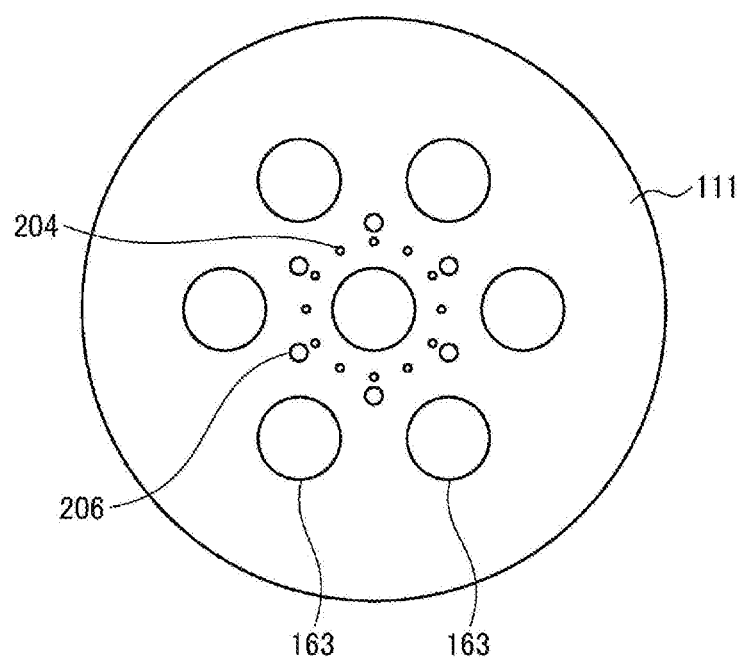
FIG. 17 is a bottom view schematically showing a ceiling wall portion of a processing chamber of the film forming apparatus shown in FIG. 14.

FIG. 14 is a cross-sectional view schematically showing an example of the film forming apparatus. FIG. 15 is a block diagram showing a configuration of a microwave introduction device of the film forming apparatus shown in FIG. 14. FIG. 16 is a cross-sectional view schematically showing a microwave radiation mechanism of the film forming apparatus shown in FIG. 14. FIG. 17 is a bottom view schematically showing a ceiling wall portion of a processing chamber of the film forming apparatus shown in FIG. 14.

The film forming apparatus 100 includes a processing chamber 101, a mounting table 102, a gas supply mechanism 103, a gas exhaust unit 104, a microwave introduction device 105, and a control unit 106.

The processing chamber 101 accommodates a substrate W during film formation. The processing chamber 101 is made of metal such as aluminum and an aluminum alloy, and has a substantially cylindrical shape. The processing chamber 101 has a plate-like ceiling wall portion 111 and a bottom wall portion 113, and a sidewall portion 112 that connects the ceiling wall portion 111 and the bottom wall portion 113.

The ceiling wall portion 111 has a plurality of openings into which microwave radiation mechanisms of the microwave introduction device 105, which will be described later, are fitted. The sidewall portion 112 is provided with a loading/unloading port 114 for loading/unloading the substrate W on which film formation is performed into/from a transfer chamber (not shown) adjacent to the processing chamber 101. The loading/unloading port 114 is opened and closed by a gate valve 115.

The mounting table 102 mounts thereon the substrate W in the processing chamber 101. The mounting table 102 has a disk shape and is made of ceramic such as AlN or the like. The mounting table 102 is supported by a cylindrical support member 120 made of ceramic such as AlN or the like and extending upward from a center of a bottom portion of the processing chamber 101.

A guide ring 181 for guiding the substrate W is provided at an outer peripheral portion of the mounting table 102. The guide ring 181 may not be provided, or may be formed as one unit with the mounting table 102. In addition, lift pins (not shown) for raising and lowering the substrate W are provided in the mounting table 102 to protrude and retract with respect to the upper surface of the mounting table 102.

A resistance heater 182 is embedded in the mounting table 102 and heats the substrate mounted on the mounting table 102 by power supplied from a heater power supply (not shown). A thermocouple (not shown) is inserted in the mounting table 102, and a heating temperature of the substrate W can be controlled to a predetermined temperature ranging from 200° C. to 600° C., for example, by a signal of the thermocouple.

An electrode 184 having a size similar to that of the substrate W is embedded above the heater 182 in the mounting table 102, and a high frequency bias power supply 122 is electrically connected to the electrode 184. A high frequency bias for drawing ions is applied from the high frequency bias power supply 122 to the mounting table 102. The high frequency bias power supply 122 may not be provided depending on the characteristics of the plasma processing.

The gas supply mechanism 103 supplies a gas for forming a hard mask film into the processing chamber 101. When the hard mask film is an SiN film, the gas may be an Si source gas such as $SiH_4$ gas, a nitrogen-containing gas such as $N_2$ gas and $NH_3$ gas, or a noble gas serving as a plasma generation gas (excitation gas) such as He gas.

The gas supply mechanism 103 includes a first gas supply unit 191, a second gas supply unit 192, a first gas injection unit 193, a second gas injection unit 194, and a third gas injection unit 195.

A plasma generation gas or a film forming gas to be dissociated with high energy, e.g., $N_2$ gas, is supplied from the first gas supply unit 191 to the first gas injection unit 193. The first gas supply unit 191 is connected to the first gas injection unit 193 disposed in the ceiling wall portion 111 through a line 201.

The first gas injection unit 193 includes: a gas diffusion space 203 disposed in the ceiling wall portion 111 and formed in a cylindrical shape about the center of the ceiling wall portion 111; and a plurality of gas injection holes 204 extending from the gas diffusion space 203 into the processing chamber 101. A gas inlet 202 is disposed at the upper surface of the ceiling wall portion 111 and connected to a line 201 extending from the first gas supply unit 191. Therefore, the first gas injection unit 193 injects the plasma generation gas or the gas to be dissociated with high energy which is supplied from the first gas supply unit 191 through the pipe 201 to a position directly below the ceiling wall portion 111.

A film forming gas whose excessive dissociation needs to be suppressed, e.g., $SiH_4$ gas as an Si source, is supplied from the second gas supply unit 192 to the second gas injection unit 194 and the third gas injection unit 195.

The second gas injection unit 194 has a plurality of nozzles 206 extending downward from the ceiling wall portion 111. The nozzles 206 are arranged at an equal interval on the circumference about the center of the ceiling wall portion 111. Although six nozzles 206 are illustrated in FIG. 17, the number of nozzles 206 is not limited to six, and may be, e.g., three or twelve. A gas flow path 207 is formed in the nozzle 206 and bent horizontally at a lower end portion of the nozzle 206. A gas injection port (not shown) is disposed at a lower portion of a sidewall of the nozzle 206. Each nozzle 206 is connected to the second gas supply unit 192 through a line 205. Therefore, the second gas injection unit 194 injects a gas whose excessive dissociation needs to be suppressed, which is supplied from the second gas supply unit 192 through the pipe 205 to a predetermined height position between the ceiling wall portion 111 and the mounting table 102.

The second gas injection unit 194 does not necessarily has the nozzles 206, and may have a ring shower in which bottom portions of a plurality of (e.g., six) pillars suspending from a plurality of ceiling wall portions 111 are connected by a ring-shaped structure and a large number of gas injection holes is formed on a bottom surface of the structure.

The third gas injection unit 195 has an annular gas diffusion space 211 formed along a circumferential direction at a height position between the mounting table 102 and the ceiling wall portion 111 in the sidewall portion 112 of the processing chamber 101. The gas diffusion space 211 is connected to the second gas supply unit 192 through a line 209. A plurality of gas injection holes 212 extends from the gas diffusion space 211 to the inner circumferential surface of the sidewall portion 112, and the nozzles 213 are respectively connected to the gas injection holes 212. Therefore, the third gas injection unit 195 injects from an outside a gas whose excessive dissociation needs to be suppressed which is supplied from the second gas supply unit 192 through the line 209 to a predetermined height position between the ceiling wall portion 111 and the mounting table 102.

The gas exhaust unit 104 is disposed in a gas exhaust line 116 connected to the bottom wall portion 113, and includes a vacuum pump and a pressure control valve. The processing chamber 101 is exhausted through the gas exhaust line 116 by the vacuum pump of the gas exhaust unit 104. A pressure in the processing chamber 101 is controlled by the pressure control valve.

The microwave introduction device 105 generates microwaves for generating plasma in the processing chamber 101 and introduces the microwaves into the processing chamber 101. The microwave introducing unit 105 is disposed at an upper portion of the processing chamber 101, and serves as a plasma generation unit for generating microwave plasma by introducing electromagnetic waves (microwaves) into the processing chamber 101.

As illustrated in FIG. 14, the microwave introduction unit 105 includes the ceiling wall portion 111 of the processing chamber 101, a microwave output unit 130, and an antenna unit 140. The ceiling wall portion 111 serves as a ceiling plate. The microwave output unit 130 generates microwaves and distributes the microwaves to a plurality of paths. The antenna unit 140 introduces the microwaves outputted from the microwave output unit 130 into the processing chamber 101.

As shown in FIG. 15, the microwave output unit 130 includes a microwave power supply 131, a microwave oscillator 132, an amplifier 133, and a distributor 134. The microwave oscillator 132 is configured as a solid state oscillator, and oscillates the microwaves at a predetermined frequency, e.g., 860 MHz, by using a phase-locked loop (PLL). The frequency of the microwaves is not limited to 860 MHz, and may be within a range from 700 MHz to 10 GHz, such as 2.45 GHz, 8.35 GHz, 5.8 GHz, 1.98 GHz, or the like. The amplifier 133 amplifies the microwaves oscillated by the microwave oscillator 132. The distributor 134 distributes the microwaves amplified by the amplifier 133 to a plurality of paths while matching an impedance between an input side and an output side.

As shown in FIG. 15, the antenna unit 140 includes a plurality of antenna modules 141. The antenna modules 141 introduce the microwaves distributed by the distributor 134 into the processing chamber 101. The antenna modules 141 have the same configuration. Each of the antenna modules 141 includes an amplifier unit 142 for amplifying and outputting the distributed microwaves, and a microwave radiation mechanism 143 for radiating the microwaves outputted from the amplifier unit 142 into the processing chamber 101.

The amplifier unit 142 includes a phase shifter 145, a variable gain amplifier 146, a main amplifier 147, and an isolator 148. The phase shifter 145 shifts the phase of the microwaves. The variable gain amplifier 146 controls a power level of the microwaves to be inputted to the main amplifier 147. The main amplifier 147 is configured as a solid state amplifier. The isolator 148 separates microwaves reflected from the antenna unit of the microwave radiation mechanism 143 to be described later toward the main amplifier 147.

As shown in FIG. 14, a plurality of microwave radiation mechanisms 143 is disposed at the ceiling wall portion 111. As shown in FIG. 16, each of the microwave radiation mechanisms 143 includes a coaxial tube 151, a power supply unit 155, a tuner 154, and an antenna unit 156.

The coaxial tube 151 has a cylindrical outer conductor 152, an inner conductor 153 coaxially arranged within the outer conductor 152, and a microwave transmission path formed therebetween.

The power supply unit 155 supplies the microwaves amplified by the amplifier unit 142 to the microwave transmission path and introduces the amplified microwaves from a side of an upper end portion of the outer conductor 152 to the microwave transmission path through the coaxial cable. The power supply unit 155 supplies the microwave power to the microwave transmission path by allowing a power supply antenna to radiate the microwaves, for example. The supplied microwave power propagates toward the antenna unit 156.

The antenna unit 156 radiates the microwaves from the coaxial tube 151 into the processing chamber 101 and is disposed at a lower end portion of the coaxial tube 151. The antenna unit 156 includes a planar antenna 161 connected to the lower end portion of the inner conductor 153, a wave retardation member 162 disposed on an upper surface of the planar antenna 161, and a microwave transmission plate 163 disposed on a bottom surface of the planar antenna 161.

The planar antenna 161 is formed in a disk shape, and has slots 161a formed therethrough. The shape of the slots 161a is appropriately set such that the microwaves are radiated effectively. A dielectric material may be inserted in the slots 161a.

The microwave transmission plate 163 is fitted into the ceiling wall portion 111, and the bottom surface thereof is exposed to the inner space of the processing chamber 101. The microwave transmission plate 163 is made of a dielectric material and has a shape that allows the microwaves to be radiated effectively in a TE mode. The microwaves transmitting through the microwave transmission plate 163 generate plasma in the inner space of the processing chamber 101.

The wave retardation member 162 is made of a material having a dielectric constant greater than that of a vacuum. The phase of the microwaves can be adjusted by the thickness of the wave retardation member 162 to maximize the radiation energy of the microwaves.

The wave retardation member 162 and the microwave transmission plate 163 may be made of, e.g., quartz, ceramic, a fluorine-based resin such as polytetrafluoroethylene resin or the like, a polyimide-based resin, or the like.

The tuner 154 forms a slug tuner. As shown in FIG. 16, the tuner 154 includes two slugs 171a and 171b, an actuator 172, and a tuner controller 173 for controlling the actuator 172. The slugs 171a and 171b are positioned closer to a base end side of the coaxial tube 151 compared to the antenna unit 156. In other words, the slugs 171a and 171b are arranged at a position higher than the antenna unit 156. The actuator 172 individually drives the slugs 171a and 171b.

The slugs 171a and 171b are formed in an annular plate shape and made of a dielectric material such as ceramic or the like. The slugs 171a and 171b are disposed between the outer conductor 152 and the inner conductor 153 of the coaxial tube 151. The actuator 172 individually drives the slugs 171a and 171b by rotating, e.g., two screws provided in the inner conductor 153 and respectively screw-coupled to the slugs 171a and 171b. Further, the actuator 172 moves the slugs 171a and 171b up and down based on an instruction from the tuner controller 173. The tuner controller 173 adjusts the positions of the slugs 171a and 171b such that an impedance of a terminal becomes 50Ω.

The main amplifier 147, the tuner 154, and the planar antenna 161 are arranged close to one other. The tuner 154 and the planar antenna 161 form a lumped constant circuit and serve as a resonator. An impedance mismatching occurs at an installation position of the planar antenna 161. Since, however, the plasma load can be directly tuned by the tuner 154, the plasma and the like can be tuned with high accuracy. Accordingly, the effect of the reflection in the planar antenna 161 can be eliminated.

As shown in FIG. 17, in this example, seven microwave radiation mechanisms 143 are disposed, and the microwave transmission plates 163 corresponding thereto are arranged equally in a hexagonal close-packed arrangement. In other words, one of the seven microwave transmission plates 163 is disposed at the center of the ceiling wall portion 111, and the other six microwave transmission plates 163 are disposed around the central microwave transmission plate 163. These seven microwave transmission plates 163 are arranged so that the adjacent microwave transmission plates are equally spaced. A plurality of (six in this example) nozzles 206 of the second gas injection unit 194 of the gas supply mechanism 103 are arranged to surround the periphery of the central microwave transmission plate 163. Similarly, a plurality of (twelve in this example) gas injection holes 204 of the first gas injection unit 193 are arranged to surround the periphery of the central microwave transmission plate 163. The number of the microwave radiation mechanisms 143 is not limited to seven.

The control unit 106 is typically a computer and controls the respective components of the film forming apparatus 100. The control unit 106 includes a storage unit storing a process sequence and a process recipe that is a control parameter of the film forming apparatus 100, an input unit, a display and the like. The control unit 106 can perform predetermined control based on a selected process recipe.

In order to form a hard mask film by the film forming apparatus 100 configured as described above, first, a substrate W that is a semiconductor wafer in which an etching target film is formed on a semiconductor base such as silicon or the like is loaded and mounted on the mounting table 102.

Next, a pressure in the processing chamber 101 and a temperature of the substrate are controlled to predetermined levels, and a hard mask film is formed by microwave plasma CVD. In this example, an SiN film is formed as the hard mask film.

During film formation, the first gas supply unit 191 supplies He gas as a plasma generation gas to the first gas injection unit 193. Then, the first gas injection unit 193 injects He gas to a region directly below the ceiling wall portion 111 of the processing chamber 101 through the gas injection holes 204. At the same time, the microwaves distributed and outputted from the microwave output unit 130 of the microwave introduction device 105 are guided to the antenna modules 141 of the antenna unit 140 and radiated from the microwave radiation mechanisms 143 to ignite the plasma.

In each antenna modules 141, the microwaves are individually amplified by the main amplifier 147 configured as the solid state amplifier. The microwaves are supplied to each microwave radiation mechanism 143, transmitted through the coaxial tube 151 and reach the antenna unit 156. At this time, the impedance is automatically matched by the slugs 171a and the slugs 171b of the tuner 154. Therefore, in a state where there is substantially no power reflection, the microwaves from the tuner 154 are radiated from the slots 161a of the planar antenna 161 through the wave retardation member 162 of the antenna unit 156. Then, the microwaves go into the microwave transmission plate 163 and reach the surface (bottom surface) of the microwave transmission plate 163 in contact with the plasma, thereby forming surface waves. Then, the microwave powers from the respective antenna units 156 are spatially combined in the processing chamber 101. Accordingly, surface wave plasma of He gas is generated in a region immediately below the ceiling wall portion 111.

At the timing of plasma ignition, a nitrogen-containing gas such as $N_2$ gas or $NH_3$ gas is supplied from the first gas supply unit 191 and injected from the first gas injection unit 193. In addition, an Si source gas, e.g., $SiH_4$ gas, is supplied from the second gas supply unit 192 and injected from the second gas injection unit 194 and the third gas injection unit 195. Accordingly, the nitrogen-containing gas and the Si source gas are excited by the plasma and react with each other, thereby forming an SiN film on the substrate W. Since the nitrogen-containing gas is injected to the region directly below the ceiling wall portion 111 of the processing chamber 101, it is sufficiently dissociated by the surface wave plasma. Further, since the Si source gas is supplied to a position away from the surface wave plasma, the excessive dissociation of the Si source gas is suppressed.

At this time, the process parameters are controlled such that the nitride film has tensile stress in any part of the film and the tensile stress increases monotonously from the bottom surface toward the upper surface of the film. For this time, the process parameters may be a flow rate of a nitrogen-containing gas and/or an Si source gas, a pressure, a microwave power, and the like. At least one of the process parameters is changed during the film formation. For example, the film formation is performed using a multi-step process recipe in which the flow rate of the nitrogen-containing gas and/or the Si source gas increases gradually.

In the film forming apparatus 100 of this example, a large-sized isolator or a combiner is not required and the influence of reflection can be reliably eliminated with a compact device configuration, which makes it possible to control plasma with high accuracy. In addition, by using microwave plasma, the film forming temperature (substrate temperature) can be lowered to 400° C. or less, and a film having a good film quality can be formed by high-density plasma at a low electron temperature.

<Other Applications>

While the embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures.

For example, in the above-described embodiments, the microwave plasma CVD film forming apparatus is used to form a hard mask film. However, the present disclosure is not limited thereto, and it is possible to use another plasma CVD film forming apparatus that does not use plasma. In addition, another film forming technique such as ALD, PVD or the like may be used instead of CVD.

In the above-described embodiments, as an example, a single-sheet processing apparatus is used. However, a batch type processing apparatus or a semi-batch type processing apparatus may be employed to process a plurality of substrates at a time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A hard mask film forming method, comprising:
preparing a substrate in which an etching target film is formed on a base; and
forming a hard mask film on the substrate while controlling film forming parameters such that a tensile stress is set as an initial film stress and the tensile stress monotonously increases from a bottom surface of the hard mask film toward an upper surface of the hard mask film,
wherein the hard mask film is used as a mask for etching the etching target film.

2. The hard mask film forming method of claim 1, wherein the hard mask film is an SiN film.

3. The hard mask film forming method of claim 1, wherein said forming the hard mask film is performed by a chemical vapor deposition.

4. The hard mask film forming method of claim 3, wherein said forming the hard mask film is performed by a plasma chemical vapor deposition.

5. The hard mask film forming method of claim 4, wherein the film forming parameter is at least one of a flow rate of a film forming gas, a pressure, and a plasma density.

6. The hard mask film forming method of claim 4, wherein plasma in the plasma chemical vapor deposition is microwave plasma.

7. The hard mask film forming method of claim 6, wherein the film forming parameter is at least one of a flow rate of a film forming gas, a pressure, and a plasma density.

8. A semiconductor device manufacturing method comprising: preparing a substrate in which an etching target film is formed on a base; forming a hard mask film on the substrate while controlling film forming parameters such that a tensile stress is set as an initial film stress and the tensile stress monotonously increases from a bottom surface of the hard mask film toward an upper surface of the hard mask film; forming a hard mask by etching the hard mask film in a predetermined pattern; and etching the etching target film while using the hard mask as a mask, wherein the hard mask film is used as a mask for etching the etching target film.

9. The semiconductor device manufacturing method of claim 8, wherein the hard mask film is an SiN film.

10. The semiconductor device manufacturing method of claim 8, wherein said forming the hard mask film is performed by a chemical vapor deposition.

11. The semiconductor device manufacturing method of claim 10, wherein said forming the hard mask film is performed by a plasma chemical vapor deposition.

12. The semiconductor device manufacturing method of claim 11, wherein the film forming parameter is at least one of a flow rate of a film forming gas, a pressure, and a plasma density.

13. The semiconductor device manufacturing method of claim 11, wherein plasma in the plasma chemical vapor deposition is microwave plasma.

14. The semiconductor device manufacturing method of claim 13, wherein the film forming parameter is at least one of a flow rate of a film forming gas, a pressure, and a plasma density.

15. A hard mask film forming apparatus comprising: a processing chamber accommodating a substrate;
a mounting table configured to mount thereon the substrate in the processing chamber;
a heating unit configured to heat the substrate on the mounting table; a microwave introduction unit configured to introduce microwaves from a ceiling wall of the processing chamber into the processing chamber;
a gas supply unit configured to supply a film forming gas into the processing chamber;
a gas exhaust unit configured to exhaust the processing chamber; and
a control unit,
wherein plasma of the film forming gas is generated by the microwaves and a hard mask film on the substrate is formed by the plasma, and
the control unit controls film forming parameters such that a tensile stress is set as an initial film stress of the hard mask film and the tensile stress increases monotonously from a bottom surface toward an upper surface of the hard mask film,
wherein the hard mask film is used as a mask for etching the etching target film.

16. The hard mask film forming apparatus of claim 15, wherein the microwave introduction unit includes:
a microwave output unit configured to output microwaves; and
a plurality of microwave radiation mechanisms, each including a tuner to which the microwaves from the microwave output unit are supplied and configured to match an impedance, a planar antenna having slots for radiating the supplied microwaves, and a microwave transmission plate that transmits the microwaves radiated from the slots.

17. The hard mask film forming apparatus of claim 15, wherein the film forming gas is a nitrogen-containing gas and an Si source gas, and an SiN film is formed as the hard mask film.

18. The hard mask film forming apparatus of claim 16, wherein the film forming parameter is at least one of a flow rate of a film forming gas, a pressure, and a plasma density.

19. The hard mask film forming apparatus of claim 15, wherein the film forming parameter is at least one of a flow rate of a film forming gas, a pressure, and a plasma density.

\* \* \* \* \*